(12) United States Patent
Nishimura et al.

(10) Patent No.: US 8,266,820 B2
(45) Date of Patent: Sep. 18, 2012

(54) SUBSTRATE PROCESSING METHOD, AND PROGRAM STORAGE MEDIUM THEREFOR

(75) Inventors: Hideki Nishimura, Tosu (JP); Mikio Nakashima, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/209,741

(22) Filed: Aug. 15, 2011

(65) Prior Publication Data

US 2011/0296707 A1    Dec. 8, 2011

Related U.S. Application Data

(62) Division of application No. 11/896,936, filed on Sep. 6, 2007, now Pat. No. 8,020,315.

(30) Foreign Application Priority Data

Sep. 7, 2006 (JP) .................................. 2006-243276

(51) Int. Cl.
   *F26B 3/00* (2006.01)
(52) U.S. Cl. .............. 34/381; 34/417; 34/524; 118/726; 118/95.2; 134/2; 134/26
(58) Field of Classification Search .................... 34/350, 34/381, 417, 497, 524, 535, 595, 90; 134/2, 134/26; 118/95.2, 726
   See application file for complete search history.

(56) References Cited

U.S. PATENT DOCUMENTS

| | | | |
|---|---|---|---|
| 1,480,804 A | 1/1924 | Fish, Jr. | 34/350 |
| 1,721,686 A | 7/1929 | Boykin | 554/9 |
| 2,422,536 A | 6/1947 | Finnegan | 34/77 |
| 2,467,435 A | 4/1949 | Langhurst | 202/173 |
| 2,573,966 A | 11/1951 | Hamlin | 8/142 |
| 2,681,512 A | 6/1954 | Armstrong | 34/526 |
| 3,152,872 A | 10/1964 | Scoggin et al. | 34/407 |

(Continued)

FOREIGN PATENT DOCUMENTS

DE    10259952 A1    7/2004

(Continued)

OTHER PUBLICATIONS

Japanese Office Action issued on Oct. 22, 2010 for Application No. 2006-243276 w/ English language translation.

*Primary Examiner* — Stephen M. Gravini

(74) *Attorney, Agent, or Firm* — Smith, Gambrell & Russell, LLP

(57) ABSTRACT

A substrate processing method which can reduce the number of particles to be left on each substrate is provided. In the substrate processing method, substrates W to be processed are dried, by using a fluid heated by a heating apparatus having one or more heating mechanisms. The substrate processing method comprises a first step of supplying a mixed fluid containing a gas and a processing liquid and heated by the heating apparatus, into a processing chamber in which the substrates to be processed are placed, and a second step of supplying the heated gas into the processing chamber. The output of at least one of the heating mechanisms is kept at a preset constant value for a period of time during which a predetermined time passes after the start of the first step. In the second step, the output of the heating mechanism is determined under a feed back control.

3 Claims, 6 Drawing Sheets

U.S. PATENT DOCUMENTS

| | | | | |
|---|---|---|---|---|
| 3,212,197 A | 10/1965 | Crawford | | 34/371 |
| 3,218,728 A | 11/1965 | Barth et al. | | 34/292 |
| 3,256,613 A | 6/1966 | Moulthrop | | 34/402 |
| 3,578,299 A | 5/1971 | Hurlbut | | 432/17 |
| 3,714,719 A | 2/1973 | Wayne | | 34/74 |
| 3,905,126 A | 9/1975 | Villalobos et al. | | 34/72 |
| 4,013,038 A | 3/1977 | Rogers et al. | | 118/666 |
| 4,064,636 A | 12/1977 | Downing | | 34/60 |
| 4,319,410 A | 3/1982 | Heilhecker et al. | | 34/75 |
| 4,484,396 A | 11/1984 | Darm | | 34/516 |
| 4,497,121 A | 2/1985 | Choinski | | 34/445 |
| 4,545,134 A | 10/1985 | Mukerjee et al. | | 34/468 |
| 4,608,764 A | 9/1986 | Leuenberger | | 34/295 |
| 4,667,418 A | 5/1987 | White | | 34/504 |
| 4,685,220 A | 8/1987 | Meenan et al. | | 588/320 |
| 4,686,779 A | 8/1987 | Wyatt et al. | | 34/168 |
| 4,731,938 A | 3/1988 | White | | 34/504 |
| 4,941,820 A | 7/1990 | Lockwood, Jr. | | 432/58 |
| 4,992,043 A | 2/1991 | Lockwood, Jr. | | 432/58 |
| 5,020,237 A | 6/1991 | Gross et al. | | 34/265 |
| 5,079,854 A | 1/1992 | Hammond et al. | | 34/187 |
| 5,083,870 A | 1/1992 | Sindelar et al. | | 366/25 |
| 5,090,132 A | 2/1992 | Kobayashi et al. | | 34/302 |
| 5,105,556 A | 4/1992 | Kurokawa et al. | | 34/470 |
| 5,105,558 A | 4/1992 | Curry | | 34/449 |
| 5,120,500 A | 6/1992 | Eggersdorfer et al. | | 422/40 |
| 5,135,122 A | 8/1992 | Gross et al. | | 219/685 |
| 5,154,007 A | 10/1992 | Piunno et al. | | 34/302 |
| 5,156,173 A | 10/1992 | Keyser et al. | | 134/61 |
| 5,160,542 A | 11/1992 | Mihira et al. | | |
| 5,177,877 A | 1/1993 | Duchesne et al. | | 34/467 |
| 5,248,393 A | 9/1993 | Schumacher et al. | | 202/158 |
| 5,335,425 A | 8/1994 | Tomizawa et al. | | 34/265 |
| 5,620,524 A | 4/1997 | Fan et al. | | |
| 5,651,193 A | 7/1997 | Rhodes et al. | | 34/531 |
| 5,659,972 A | 8/1997 | Min et al. | | 34/255 |
| 5,673,496 A | 10/1997 | Wegner et al. | | 34/471 |
| 5,709,037 A | 1/1998 | Tanaka et al. | | 34/330 |
| 5,780,295 A | 7/1998 | Livesey et al. | | 435/307.1 |
| 5,813,134 A | 9/1998 | Min et al. | | 34/255 |
| 5,884,640 A | 3/1999 | Fishkin et al. | | 134/95.2 |
| 5,908,292 A | 6/1999 | Smith et al. | | 432/197 |
| 5,913,981 A | 6/1999 | Florez | | 134/3 |
| 5,940,985 A | 8/1999 | Kamikawa et al. | | 34/471 |
| 5,950,328 A | 9/1999 | Ichiko et al. | | 34/364 |
| 5,968,285 A | 10/1999 | Ferrell et al. | | 134/26 |
| 5,981,022 A | 11/1999 | Min et al. | | 428/98 |
| 5,985,041 A | 11/1999 | Florez | | 134/2 |
| 6,009,635 A | 1/2000 | Vidaurre et al. | | 34/92 |
| 6,029,371 A | 2/2000 | Kamikawa et al. | | 34/516 |
| 6,042,369 A | 3/2000 | Bergman et al. | | 432/15 |
| 6,067,728 A | 5/2000 | Farmer et al. | | 34/470 |
| 6,095,167 A | 8/2000 | Florez | | 134/183 |
| 6,134,807 A | 10/2000 | Komino et al. | | 34/418 |
| 6,143,219 A | 11/2000 | Vidaurre et al. | | 264/102 |
| 6,165,277 A | 12/2000 | Florez | | 134/2 |
| 6,185,842 B1 | 2/2001 | Brashears | | 34/369 |
| 6,199,298 B1 | 3/2001 | Bergman | | 34/315 |
| 6,223,449 B1 | 5/2001 | Johnson et al. | | 34/62 |
| 6,270,584 B1 | 8/2001 | Ferrell et al. | | 134/26 |
| 6,270,708 B1 | 8/2001 | Gurol | | 264/117 |
| 6,272,768 B1 | 8/2001 | Danese | | 34/275 |
| 6,282,812 B1 | 9/2001 | Wee et al. | | 34/464 |
| 6,328,809 B1 | 12/2001 | Elsawy et al. | | 134/3 |
| 6,589,359 B2 | 7/2003 | Kamikawa et al. | | 134/26 |
| 6,625,901 B1 | 9/2003 | Mehmandoust et al. | | 34/476 |
| 6,729,040 B2 | 5/2004 | Mehmandoust | | 34/443 |
| 6,915,592 B2 | 7/2005 | Guenther | | 34/582 |
| 6,918,192 B2 | 7/2005 | Yang | | 34/73 |
| 6,922,910 B2 | 8/2005 | Tsuji et al. | | 34/210 |
| 6,931,205 B2 | 8/2005 | Atkins | | 392/484 |
| 7,055,262 B2 | 6/2006 | Goldberg et al. | | 34/86 |
| 7,107,999 B2 | 9/2006 | Sasaki | | 134/66 |
| 7,353,623 B2 | 4/2008 | Asuke | | 34/381 |
| 7,404,262 B2 | 7/2008 | Jurkovich et al. | | 34/381 |
| 7,437,834 B2 | 10/2008 | Nakatsukasa et al. | | 34/381 |
| 7,543,396 B2 | 6/2009 | Nishino et al. | | 34/606 |
| 7,665,227 B2 | 2/2010 | Wright et al. | | 34/339 |
| 7,730,633 B2 | 6/2010 | Jurkovich et al. | | 34/381 |
| 7,809,253 B2 | 10/2010 | Mudry et al. | | 392/360 |
| 7,913,417 B2 | 3/2011 | Patka et al. | | 34/259 |
| 7,921,578 B2 | 4/2011 | McAllister et al. | | 34/597 |
| 2001/0006991 A1 | 7/2001 | Vidaurre et al. | | 524/494 |
| 2001/0047595 A1 | 12/2001 | Mehmandoust | | 34/443 |
| 2002/0032973 A1 | 3/2002 | Jung | | 34/467 |
| 2003/0221331 A1 | 12/2003 | Reddoch | | 34/58 |
| 2004/0000069 A1 | 1/2004 | Gurol | | 34/592 |
| 2004/0025370 A1 | 2/2004 | Guenther | | 34/576 |
| 2004/0055177 A1 | 3/2004 | Tsuji et al. | | 34/618 |
| 2005/0087211 A1 | 4/2005 | Park et al. | | 134/2 |
| 2005/0147749 A1 | 7/2005 | Liu et al. | | |
| 2005/0220984 A1 | 10/2005 | Sun et al. | | 427/8 |
| 2005/0268853 A1 | 12/2005 | Yamamoto et al. | | |
| 2005/0274035 A1 | 12/2005 | Beal et al. | | 34/63 |
| 2006/0112588 A1 | 6/2006 | Ness et al. | | 34/513 |
| 2006/0137213 A1 | 6/2006 | Asuke | | 34/402 |
| 2006/0179676 A1 | 8/2006 | Goldberg et al. | | 34/77 |
| 2006/0236559 A1 | 10/2006 | Mori | | 34/380 |
| 2007/0006483 A1 | 1/2007 | Kamikawa et al. | | 34/467 |
| 2007/0017113 A1 | 1/2007 | Scharpf et al. | | 34/86 |
| 2007/0119486 A1 | 5/2007 | Park et al. | | 134/95.2 |
| 2007/0175061 A1 | 8/2007 | Patka et al. | | 34/265 |
| 2007/0186340 A1 | 8/2007 | Gay | | 4/597 |
| 2008/0060214 A1 | 3/2008 | Nishimura et al. | | 34/350 |
| 2008/0115380 A1 | 5/2008 | Nishino et al. | | 34/58 |
| 2009/0077825 A1 | 3/2009 | Toofan et al. | | 34/273 |
| 2009/0090022 A1 | 4/2009 | Ho et al. | | 34/406 |
| 2010/0043839 A1 | 2/2010 | Hamada et al. | | 134/30 |
| 2010/0115785 A1 | 5/2010 | Ben-Shmuel et al. | | 34/260 |
| 2011/0296707 A1* | 12/2011 | Nishimura et al. | | 34/467 |

FOREIGN PATENT DOCUMENTS

| | | |
|---|---|---|
| EP | 0 419 939 B1 | 2/1994 |
| EP | 923985 A1 | 6/1999 |
| JP | 56049802 A | 5/1981 |
| JP | 58193007 A | 11/1983 |
| JP | 60147515 A | 8/1985 |
| JP | 60255524 A | 12/1985 |
| JP | 02144216 A | 6/1990 |
| JP | 02305642 A | 12/1990 |
| JP | 04161160 A | 6/1992 |
| JP | 10-125649 | 5/1998 |
| JP | 11-154026 | 6/1999 |
| JP | 11-305805 | 11/1999 |
| JP | 2000208504 A | 7/2000 |
| JP | 2000212750 A | 8/2000 |
| JP | 2000219970 A | 8/2000 |
| JP | 2000277503 A | 10/2000 |
| JP | 2000277504 A | 10/2000 |
| JP | 2000277505 A | 10/2000 |
| JP | 2001049434 A | 2/2001 |
| JP | 2004345375 A | 12/2004 |
| JP | 2005-64482 | 3/2005 |
| JP | 2006194531 A | 7/2006 |
| JP | 2008066535 A | 3/2008 |
| WO | WO 9208930 A1 | 5/1992 |
| WO | 2005/068682 A2 | 7/2005 |

* cited by examiner

SUBSTRATE PROCESSING METHOD, AND PROGRAM STORAGE MEDIUM THEREFOR

CROSS REFERENCE TO RELATED APPLICATION

This application is a division of Ser. No. 11/896,936 filed Sep. 6, 2007 and which is being incorporated in its entirety herein by reference.

CROSS REFERENCE TO RELATED APPLICATIONS

This application is based on and claims the benefit of priority from the prior Japanese Patent Application No. 2006-243276 filed on Sep. 7, 2006, the entire contents of which are incorporated herein by reference.

BACKGROUND OF THE INVENTION

1. Field of the Invention

The present invention relates to a substrate processing method and a substrate processing apparatus, for drying substrates to which a process, such as a cleaning process, is provided, and particularly to a substrate processing method and a substrate processing apparatus, which can reduce the number of particles to be attached to the substrates after a drying process.

The present invention relates to a substrate processing method for drying substrates to which a process, such as a cleaning process, is provided, and in particular to a program storage medium for storing a program for executing a substrate processing method, which can reduce the number of particles to be attached to the substrates after a drying process.

2. Description of the Related Art

A lot of processes provided to substrates to be processed, such as silicon wafers, are performed while the substrates are in a wetted state. As a typical example of such processes, a cleaning process including a rinsing process can be mentioned. In order to prevent attachment of a large number of particles to each substrate via a liquid and/or prevent dried marks, such as water marks, from being left on the substrate, upon drying the liquid, a separate drying process should be provided to the substrate in order to avoid occurrence of such disadvantages, after completion of any process using the liquid.

The degree of such disadvantages is generally assessed by using measurements obtained due to a meter, such as a particle counter or the like. That is to say, the meter can counts the number of deposits or uneven colors remaining on the substrate after the drying process as the number of particles, and the degree of such disadvantages can be assessed by the number of particles measured by the meter. Accordingly, as used herein, the term "particles" includes, unless otherwise stated, not only particulate deposits, but also cloudy marks, such as water marks, and/or other defects attributable to the drying process.

As the drying method for the substrate, there is known a method in which a processing liquid (e.g., IPA) exhibiting some volatility and liquid-philicity is vaporized so as to create an atmosphere of the vaporized processing liquid around the substrate(s) (see, for example, Japanese Laid-Open Patent Publication No. 10-125649, the entire contents of which are incorporated herein by reference). In this method, a layer of a liquid or droplets are removed from the substrate(s) due to the volatility and liquid-philicity of the processing liquid. In this method, as disclosed in Japanese Laid-Open Patent Publication No. 10-125649, the processing liquid is supplied into a heating apparatus together with an inert gas, which also serves as a carrier gas, and is then heated and vaporized in the heating apparatus.

In recent years, with further complication of a pattern to be formed on each wafer, enhancement of ability to dry up the wafer has been greatly needed. In this case, increase of the supply amount of the vaporized processing liquid is essential. However, according to a study made by the inventor, if increasing the supply amount of the vaporized processing liquid, i.e., the supply amount of the processing liquid into the heating apparatus, it has been found that the number of particles to be left on the substrate(s) to be processed would be increased.

SUMMARY OF THE INVENTION

The inventor has investigated the relationship between a method of controlling the heating mechanism of the heating apparatus for heating a mixed fluid containing the processing liquid and the inert gas, and the number of particles to be left on the substrate(s) to be processed. As a result, the inventor has known that the controlling method for the heating apparatus has significant influence on the number of particles to be left on the substrate(s) to be processed. The present invention was made in view of the above.

A first substrate processing method according to the present invention is a substrate processing method for drying a substrate, by using a fluid heated by a heating apparatus including an inlet, an outlet, and one or more heating mechanisms for heating the fluid flowing from the inlet to the outlet, the method comprising: a first step of supplying a gas and a processing liquid, into the heating apparatus, from the inlet, heating a mixed fluid containing the gas and the processing liquid, in the heating apparatus, as well as supplying the heated mixed fluid discharged from the outlet of the heating apparatus, into a processing chamber in which the substrate is placed; and a second step of supplying a gas, into the heating apparatus, from the inlet, heating the gas, in the heating apparatus, as well as supplying the heated gas discharged from the outlet of the heating apparatus, into the processing chamber, wherein, in the first step, an output of at least one of the one or more heating mechanisms of the heating apparatus is kept at a preset constant value for a period of time during which a predetermined time passes after the start of supplying the processing liquid into the heating apparatus, and wherein, in the second step, outputs of the one or more heating mechanisms of the heating apparatus are determined, under a feed back control, in order to set the temperature of the gas, during or after the heating process, at a preset value.

According to the first substrate processing method of the present invention, the mixed fluid containing the gas and the processing liquid can be supplied into the processing chamber accommodating the substrate therein, in a state suitable for drying the substrate. Consequently, the number of particles to be attached onto the substrate after dried can be significantly reduced. Also, the ability to dry up the substrate can be securely enhanced by increasing the supply amount of the processing liquid. In addition, the substrate processing method according to the present invention can be carried out only by modifying a method of controlling an existent substrate processing apparatus.

In the first substrate processing method according to the present invention, the heating apparatus may include a plurality of heating mechanisms arranged in succession from the inlet to the outlet, and wherein, in the first step, an output of one of the plurality of heating mechanisms located nearest to the inlet may be kept at the preset constant value for the period of time during which the predetermined time passes. In this case, in the first step, an output of one of the plurality of heating mechanisms located nearest to the outlet may be determined, under the feed back control, in order to set the temperature of the mixed fluid, during or after the heating process, at a preset value.

In the first step of the first substrate processing method according to the present invention, the output of the at least one heating mechanism may be kept at the constant value for a period of time during which the processing liquid is supplied into the heating apparatus. With such a substrate processing method, the control method can be further simplified. Alternatively, in the first step of the first substrate processing method, the output of the at least one heating mechanism may be determined, under the feed back control, in order to set the temperature of the mixed fluid, during or after the heating process, at a preset value, for at least a period of time after the predetermined time has passed after the start of supplying the processing liquid into the heating apparatus.

A second substrate processing method according to the present invention is a substrate processing method for drying a substrate, by using a fluid heated by a heating apparatus including an inlet, an outlet, and a plurality of heating mechanisms for heating the fluid flowing from the inlet to the outlet, the method comprising the steps of: placing a substrate in a processing chamber; and supplying a gas and a processing liquid, into the heating apparatus, from the inlet, heating a mixed fluid containing the gas and the processing liquid, in the heating apparatus, as well as supplying the heated mixed fluid discharged from the outlet of the heating apparatus, into the processing chamber in which the substrate is placed, wherein, in the step of supplying the mixed fluid into the processing chamber, an output of one of the plurality of heating mechanisms located nearest to the inlet of the heating apparatus is kept at a preset constant value for a period of time during which a predetermined time passes after the start of supplying the processing liquid into the heating apparatus, while an output of one of the plurality of heating mechanisms located nearest to the outlet is determined, under a feed back control, in order to set the temperature of the mixed fluid, during or after the heating process, at a preset value.

According to the second substrate processing method of the present invention, the mixed fluid containing the gas and the processing liquid can be supplied into the processing chamber containing the substrate therein, in a state suitable for drying the substrate. Consequently, the number of particles to be attached onto the substrate after dried can be significantly reduced. Also, the ability to dry up the substrate can be securely enhanced by increasing the supply amount of the processing liquid. In addition, the substrate processing method according to the present invention can be carried out only by modifying a method of controlling an existent substrate processing apparatus.

In the step of supplying the mixed fluid into the processing chamber of the second substrate processing method according to the present invention, the output of the heating mechanism located nearest to the inlet may be kept at the constant value for a period of time during which the processing liquid is supplied into the heating apparatus. With such a substrate processing method, the control method can be significantly simplified.

A first substrate processing apparatus according to the present invention is a substrate processing apparatus, comprising: a heating apparatus including an inlet, an outlet, a fluid passage extending from the inlet to the outlet, and one or more heating mechanisms that heat the fluid passage; a processing chamber connected with the outlet of the heating apparatus and configured to dry up a substrate placed therein, by using a fluid heated by the heating apparatus and supplied into the processing chamber; and a control device that controls an output of the one or more heating mechanisms, wherein the control device is configured to perform a substrate drying process including a first step of supplying a mixed fluid containing a gas and a processing liquid and heated by the heating apparatus, into the processing chamber, and a second step of supplying a gas heated by the heating apparatus, into the processing chamber, wherein, in the first step, the control device keeps an output of at least one of the one or more heating mechanisms of the heating apparatus at a preset constant value for a period of time during which a predetermined time passes after the start of supplying the processing liquid into the heating apparatus, and wherein, in the second step, the control device determines outputs of the one or more heating mechanisms of the heating apparatus, under a feed back control, in order to set the temperature of the gas, during or after the heating process, at a preset value.

According to the first substrate processing apparatus of the present invention, the mixed fluid containing the gas and the processing liquid can be supplied into the processing chamber accommodating the substrate therein, in a state suitable for drying the substrate. Thus, the number of particles to be attached onto the substrate after dried can be significantly reduced. Also, the ability to dry up the substrate can be securely enhanced by increasing the supply amount of the processing liquid.

In the first substrate processing apparatus according to the present invention, the heating apparatus includes a plurality of heating mechanisms arranged in succession from the inlet to the outlet, and wherein, in the first step of the drying process, the control device may keep an output of one of the plurality of heating mechanisms located nearest to the inlet at the preset constant value for the period of time during which the predetermined time passes. In this case, in the first step of the drying process, the control device may determine an output of one of the plurality of heating mechanisms located nearest to the outlet, under the feed back control, in order to set the temperature of the mixed fluid, during or after the heating process, at a preset value.

In the first step of the drying process, due to the first substrate processing apparatus according to the present invention, the control device may keep the output of the at least one heating mechanism at the constant value for a period of time during which the processing liquid is supplied into the heating apparatus. Alternatively, in the first step of the drying process, due to the first substrate processing apparatus according to the present invention, the control device may determine the output of the at least one heating mechanism, under the feed back control, in order to set the temperature of the mixed fluid, during or after the heating process, at a preset value, for at least a period of time after the predetermined time has passed after the start of supplying the processing liquid into the heating apparatus.

A second substrate processing apparatus according to the present invention is a substrate processing apparatus, comprising: a heating apparatus including an inlet, an outlet, a fluid passage extending from the inlet to the outlet, and a plurality of heating mechanisms that heat the fluid passage; a processing chamber connected with the outlet of the heating apparatus and configured to dry up a substrate placed therein, by using a fluid heated by the heating apparatus and supplied into the processing chamber; and a control device that controls each output of the plurality of heating mechanisms, wherein the control device is configured to perform a substrate drying process including a step of supplying a mixed fluid containing a gas and a processing liquid and heated by the heating apparatus, into the processing chamber, wherein, the control device keeps an output of one of the plurality of heating mechanisms located nearest to the inlet of the heating apparatus at a preset constant value for a period of time during which a predetermined time passes after the start of supplying the processing liquid into the heating apparatus, and wherein, the control device determines an output of one of the plurality of heating mechanisms located nearest to the outlet, under a feed back control, in order to set the temperature of the mixed fluid, during or after the heating process, at a preset value.

According to the second substrate processing apparatus of the present invention, the mixed fluid containing the gas and the processing liquid can be supplied into the processing chamber accommodating the substrate therein, in a state suitable for drying the substrate. Consequently, the number of particles to be attached onto the substrate after dried can be significantly reduced. Also, the ability to dry up the substrates can be securely enhanced by increasing the supply amount of the processing liquid.

In the second substrate processing apparatus according to the present invention, the control device may keep the output of the heating mechanism located nearest to the inlet, at a constant value, for a period of time during which the processing liquid is supplied into the heating apparatus.

A first program according to the present invention is a program to be executed by a control device that controls a substrate processing apparatus including a heating apparatus having an inlet, an outlet, and one or more heating mechanisms that heat a fluid flowing from the inlet to the outlet, wherein the program is configured to perform a substrate processing method by using a substrate processing apparatus, the substrate processing method being for drying up a substrate, by using the fluid heated by the heating apparatus, and the method comprising: a first step of supplying a gas and a processing liquid, into the heating apparatus, from the inlet, heating a mixed fluid containing the gas and the processing liquid, in the heating apparatus, as well as supplying the heated mixed fluid discharged from the outlet of the heating apparatus, into a processing chamber in which the substrate is placed; and a second step of supplying a gas, into the heating apparatus, from the inlet, heating the gas, in the heating apparatus, as well as supplying the heated gas discharged from the outlet of the heating apparatus, into the processing chamber, wherein, in the first step, an output of at least one of the one or more heating mechanisms of the heating apparatus is kept at a preset constant value for a period of time during which a predetermined time passes after the start of supplying the processing liquid into the heating apparatus, and wherein, in the second step, outputs of the one or more heating mechanisms of the heating apparatus are determined, under a feed back control, in order to set the temperature of the gas, during or after the heating process, at a preset value.

A first storage medium according to the present invention is a storage medium for storing a program to be executed by a control device that controls a substrate processing apparatus including a heating apparatus having an inlet, an outlet, and one or more heating mechanisms that heat a fluid flowing from the inlet to the outlet, wherein the program is configured to perform a substrate processing method by using a substrate processing apparatus, the substrate processing method being for drying up a substrate, by using the fluid heated by the heating apparatus, and the method comprising: a first step of supplying a gas and a processing liquid, into the heating apparatus, from the inlet, heating a mixed fluid containing the gas and the processing liquid, in the heating apparatus, as well as supplying the heated mixed fluid discharged from the outlet of the heating apparatus, into a processing chamber in which the substrate is placed; and a second step of supplying a gas, into the heating apparatus, from the inlet, heating the gas, in the heating apparatus, as well as supplying the heated gas discharged from the outlet of the heating apparatus, into the processing chamber, wherein, in the first step, an output of at least one of the one or more heating mechanisms of the heating apparatus is kept at a preset constant value for a period of time during which a predetermined time passes after the start of supplying the processing liquid into the heating apparatus, and wherein, in the second step, outputs of the one or more heating mechanisms of the heating apparatus are determined, under a feed back control, in order to set the temperature of the gas, during or after the heating process, at a preset value.

A second program according to the present invention is a program to be executed by a control device that controls a substrate processing apparatus including a heating apparatus having an inlet, an outlet, and a plurality of heating mechanisms that heat a fluid flowing from the inlet to the outlet, wherein the program is configured to perform a substrate processing method by using a substrate processing apparatus, the substrate processing method being for drying up a substrate, by using the fluid heated by the heating apparatus, and the method comprising the steps of: placing the substrate in a processing chamber; and supplying a gas and a processing liquid, into the heating apparatus, from the inlet, heating a mixed fluid containing the gas and the processing liquid, in the heating apparatus, as well as supplying the heated mixed fluid discharged from the outlet of the heating apparatus, into the processing chamber in which the substrate is placed, wherein, in the step of supplying the mixed fluid into the processing chamber, an output of one of the plurality of heating mechanisms located nearest to the inlet of the heating apparatus is kept at a preset constant value for a period of time during which a predetermined time passes after the start of supplying the processing liquid into the heating apparatus, while an output of one of the plurality of heating mechanisms located nearest to the outlet is determined, under a feed back control, in order to set the temperature of the mixed fluid, during or after the heating process, at a preset value.

A second storage medium according to the present invention is a storage medium for storing a program to be executed by a control device that controls a substrate processing apparatus including a heating apparatus having an inlet, an outlet, and a plurality of heating mechanisms that heat a fluid flowing from the inlet to the outlet, wherein the program is configured to perform a substrate processing method by using a substrate processing apparatus, the substrate drying method being for drying up a substrate, by using the fluid heated by the heating apparatus, and the method comprising the steps of: placing the substrate in a processing chamber; and supplying a gas and a processing liquid, into the heating apparatus, from the inlet, heating a mixed fluid containing the gas and the processing liquid, in the heating apparatus, as well as supplying the heated mixed fluid discharged from the outlet of the heating apparatus, into the processing chamber in which the substrate is placed, wherein, in the step of supplying the mixed fluid into the processing chamber, an output of one of the plurality of heating mechanisms located nearest to the inlet of the heating apparatus is kept at a preset constant value for a period of time during which a predetermined time passes after the start of supplying the processing liquid into the heating apparatus, while an output of one of the plurality of heating mechanisms located nearest to the outlet is determined, under a feed back control, in order to set the temperature of the mixed fluid, during or after the heating process, at a preset value.

According to the present invention, the number of particles to be attached onto the substrate after dried can be significantly reduced. Additionally, the ability to dry up the substrate can be further enhanced by increasing the supply amount of the processing liquid.

DETAILED DESCRIPTION OF THE INVENTION

Hereinafter, one embodiment of the present invention will be described with reference to the drawings. In the embodiment described below, one example in which a substrate processing apparatus according to the present invention is applied to a processing apparatus to process semiconductor wafers, more specifically, to a cleaning apparatus to clean semiconductor wafers. However, the substrate processing apparatus according to the present invention is not limited to use in cleaning semiconductor wafers, but can be applied to processes for a wider range of substrates.

Figure 1:
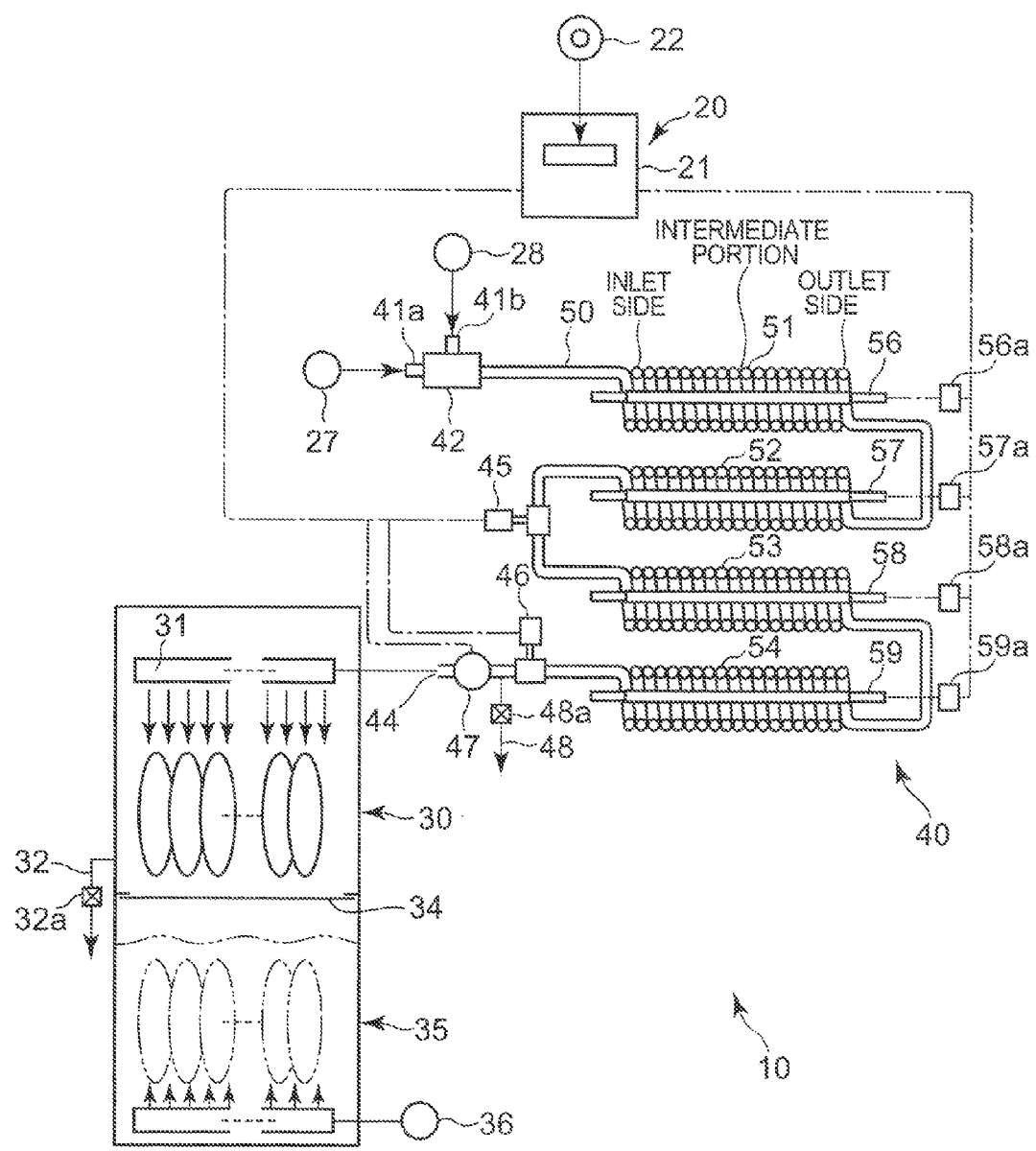
FIG. 1 is a schematic illustration, showing a construction of one embodiment of a substrate processing apparatus according to the present invention.
Figure 2:
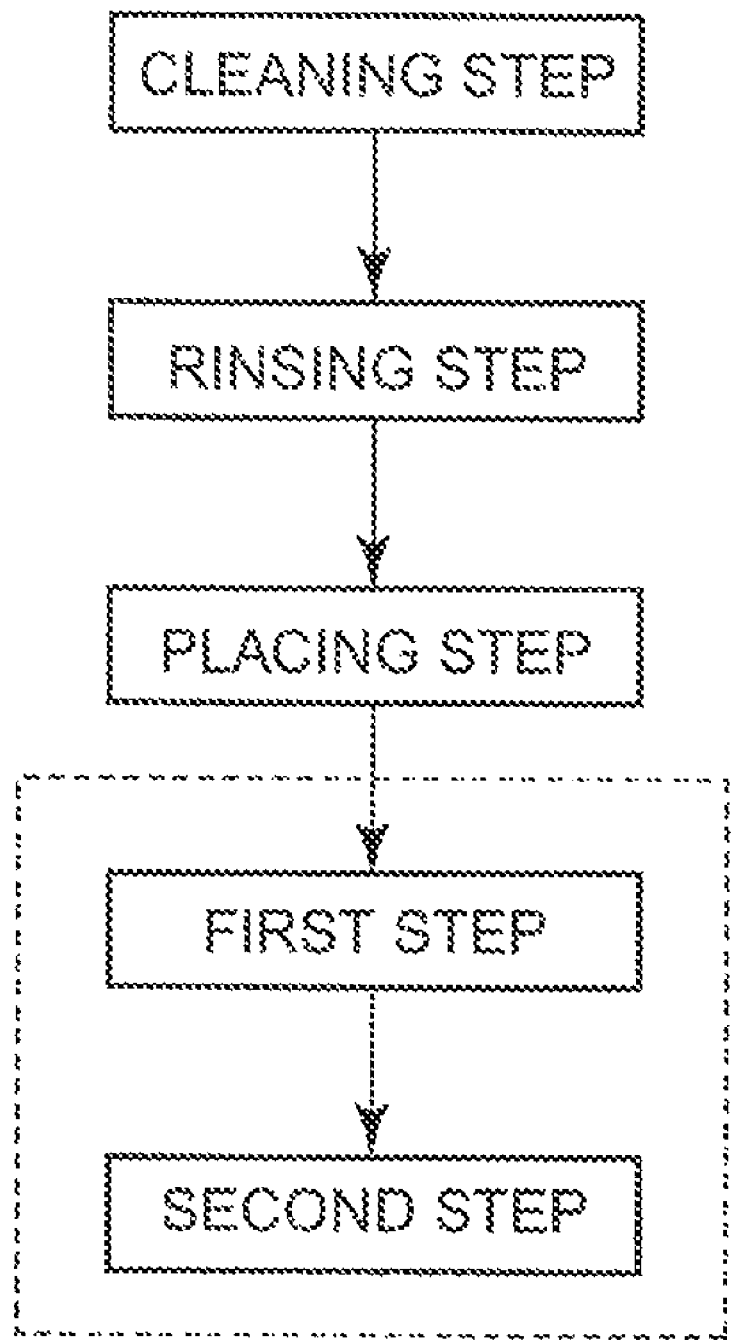
FIG. 2 is a diagram for explaining one embodiment of a substrate processing method according to the present invention.

FIGS. 1 to 9 are those for illustrating one embodiment of a substrate processing method and a substrate processing apparatus according to the present invention. Among the drawings, FIG. 1 is a schematic illustration, showing the construction of the substrate processing apparatus, and FIG. 2 is a diagram for explaining the substrate processing method.

First, referring to FIG. 1, the substrate processing apparatus 10 will be described. In this embodiment, the substrate processing apparatus 10 includes a cleaning chamber 35 configured to clean semiconductor wafers (substrates to be processed) W accommodated therein, a processing chamber 30 which is connected with the cleaning chamber 35 and is configured to receive the wafers W after cleaned, a heating apparatus 40 connected with the processing chamber 30, and a control device 20 connected with a heating apparatus 40. The substrate processing apparatus 10 of this type is configured to clean the semiconductor wafers W as well as to dry up the wafers W after cleaned.

As shown in FIG. 1, in this embodiment, the cleaning chamber 35 is designed to receive multiple sheets of wafers W, for example, 50 sheets of wafers W, therein. The cleaning chamber 35 is connected with a pure water supply source 36, so as to be supplied with pure water (DIW) from the pure water supply source 36. Thus, the multiple sheets of wafers W having been subjected to some cleaning process in the cleaning chamber 35 can then be subjected to a rinsing process by using the pure water to be supplied from the pure water supply source 36. As an example of the cleaning process provided to the wafers in the cleaning chamber 35, an ultrasound cleaning process can be mentioned.

As shown in FIG. 1, similar to the cleaning chamber 35, the processing chamber 30 is also configured to receive multiple sheets of wafers W, for example, 50 sheets of wafers W, therein. In the processing chamber 30, injection ports 31 are provided, each injection port 31 being connected with the heating apparatus 40. As will be described later, a heated fluid is supplied from the heating apparatus 40 and supplied into the processing chamber 30 via the injection ports 31, thereby to dry up the wafers W contained in the processing chamber 30.

A drain 32 is provided to the processing chamber 32. In addition, a valve 32a is provided to the drain 32, so that the internal pressure of the processing chamber 30 can be controlled by opening and closing operation of the valve.

As shown in FIG. 1, an opening and closing mechanism 34 is provided between the cleaning chamber 35 and the processing chamber 30. Thus, the communication between the cleaning chamber 35 and the processing chamber 30 can be blocked by closing the opening and closing mechanism 34. As the opening and closing mechanism 34, a well known opening and closing means, such as a shutter, may be used.

Next, the heating apparatus 40 will be described. As shown in FIG. 1, in this embodiment, the heating apparatus includes, inlets 41a, 41b, an outlet 44, a piping (fluid passage) 50 extending from the inlets 41a, 41b to the outlet 44, and heating mechanisms 56, 57, 58, 59 each provided for heating the piping 50.

As shown in FIG. 1, two inlets 41a, 41b are provided to the heating apparatus 40. One of the inlet 41a is connected with an inert gas supply source 27, and the other inlet 41b is connected with a processing liquid supply source 28. In this embodiment, the inert gas supply source 27 is designed to supply nitrogen gas to the inlet 41a, at a predetermined flow rate, via appropriate equipment, such as a flow rate control valve. Additionally, in this embodiment, the processing liquid supply source 28 is configured to supply IPA (isopropyl alcohol) as a processing liquid to the inlet 41b, at a predetermined flow rate, via an appropriate means, such as a flow rate control valve. The two inlets 41*a*, 41*b* are connected with a confluence section 42, such that the fluids to be supplied from the respective inlets 41*a*, 41*b* can flow together in the confluence section 42. For instance, the confluence section 41 is composed of a mixing valve or two-fluid nozzle.

In this embodiment, the first to fourth heating mechanisms 56, 57, 58, 59 are provided in the heating apparatus 40 to be arranged, in succession, from the inlets 41*a*, 41*b* toward the outlet 44. In this embodiment, each of the heating mechanisms 56, 57, 58, 59 is composed of a halogen lamp extending in a bar-like fashion. As shown in FIG. 1, the heating mechanisms 56, 57, 58, 59 are respectively connected with separate power controllers 56*a*, 57*a*, 58*a*, 59*a*, such that the heating mechanisms 56, 57, 58, 59 can be supplied with power from these power controllers 56*a*, 57*a*, 58*a*, 59*a*. The power controllers 56*a*, 57*a*, 58*a*, 59*a* are also connected with the control device 20, respectively. Thus, the control device 20 can determine the power of the respective heating mechanisms 56, 57, 58, 59, via the respectively corresponding power controllers. In this case, the amount of power to be supplied to the halogen lamp from the respective power controllers 56*a*, 57*a*, 58*a*, 59*a* is controlled individually by the control device 20.

As shown in FIG. 1, the piping 50 includes first to fourth spiral portions 51, 52, 53, 54 provided to be arranged, in succession, from the inlets 41*a*, 41*b* toward the outlet 44, respectively corresponding to the first and fourth heating mechanisms 56, 57, 58, 59. Each spiral portion 51, 52, 53, 54 is formed to be wound around a corresponding portion of the piping 50, with almost no gap provided between the resultant windings. Thus, each spiral portion takes a cylindrical shape. As shown in FIG. 1, the elongated heating mechanisms 56, 57, 58, 59 are respectively arranged to extend through the centers of the spiral portions 51, 52, 53, 54 each having the cylindrical shape. In other words, each spiral portion 51, 52, 53, 54 is arranged to externally surround each corresponding heating mechanism 56, 57, 58, 59.

In the heating apparatus 40 having the construction as described above, the energy to be generated from the heating mechanisms 56, 57, 58, 59 each composed of a halogen lamp will be received by the spiral portions 51, 52, 53, 54 surrounding the heating mechanisms 56, 57, 58, 59, respectively. Due to the energy received, the spiral portions 51, 52, 53, 54 will then be heated, so that the fluid flowing in the spiral portions 51, 52, 53, 54 can be heated.

In the heating apparatus 40 as described above, it is preferred that the spiral portions 51, 52, 53, 54 are coated with a black color paint such that they can effectively absorb the energy irradiated from the heating mechanisms 56, 57, 58, 59. In order to prevent significant loss of energy, it is also preferred that the spiral portions 51, 52, 53, 54 including the heating mechanisms 56, 57, 58, 59 are each arranged in a container formed of a heat insulating material.

As shown in FIG. 1, in this embodiment, an intermediate temperature sensor 45 configured to measure the temperature in the piping 50 is provided between the second spiral portion 52 and the third spiral portion 53. In addition, a final temperature sensor 46 configured to measure the temperature in the piping 50 is provided between the fourth spiral portion 54 and the outlet 44. Furthermore, a mass flow meter 47 configured to control the flow rate of the fluid flowing through the piping 50 is provided between the fourth spiral portion 54 and the outlet 44. The intermediate temperature sensor 45, final temperature sensor 46 and mass flow meter 47 are also connected with the control device 20, as shown in FIG. 1.

A drain 48 is provided to the piping 50, and as shown in FIG. 1, the drain 48 is located on the upstream side of the mass flow meter 47. A valve 48*a* is provided to the drain 48, such that the fluid flowing through the piping 50 can be discharged outside, by opening and closing operation of the valve 48*a*.

The control device 20 is connected with each component of the substrate processing apparatus 10, such that the control device 20 can control the operation of each component. In this embodiment, the control device 20 includes, a computer 21, and a program storage medium 22 which is readable by the computer 21. When the computer 21 executes a program stored in advance in the storage medium 22, a process for the wafers W to be processed can be performed by using the substrate cleaning apparatus 10.

In one example, the control device 20 is designed to individually control the amount of power to be supplied to the heating mechanism 56, 57, 58, 59 from the corresponding power controllers 56*a*, 57*a*, 58*a*, 59*a*, respectively, in accordance with the preset program (data). The control device 20 can calculate the output of each heating mechanism 56, 57, 58, 59, under a feed back control based on detected values to be obtained from each temperature sensors 45, 46, in order to set the temperature of the fluid flowing through the piping 50 at a desired temperature. In this case, based on the temperatures to be detected by the respective temperature sensors 45, 46, the amount of power to be supplied from the power controllers 56*a*, 57*a*, 58*a*, 59*a* will be changed, respectively, as such the output of each heating mechanism 56, 57, 58, 59 will also be changed. Meanwhile, in this embodiment, the control device 20 can also supply the power to each heating mechanism 56, 57, 58, 59 from the corresponding power controllers 56*a*, 57*a*, 58*a*, 59*a*, such that the output of each heating mechanism 56, 57, 58, 59 will be constant. In this case, even though the detected values due to the respective temperature sensors 45, 46 would be changed, the amount of power to be supplied from the respective power controllers 56*a*, 57*a*, 58*a*, 59*a* will be kept at a constant value.

Next, one example of the processing method for the wafers W by using the substrate processing apparatus 10 having the above construction will be described.

As shown in FIG. 2, in this embodiment, the wafers W to be processed are subjected to a cleaning process in the cleaning chamber 35 (cleaning step). As described above, as the cleaning process, an ultrasound cleaning process using a cleaning liquid can be mentioned. Subsequently, the wafers W are subjected to a rinsing process in the cleaning chamber 35 (rinsing step). In this step, the wafers W to be processed are immersed, for example, in pure water to be supplied from the pure water supply source 36, so as to wash away the cleaning liquid used in the cleaning process.

Once the rinsing step is finished, the opening and closing mechanism 34, which has separated the cleaning chamber 35 from the processing chamber 30, is opened, thus bringing the cleaning chamber 35 into communication with the processing chamber 30. Thereafter, the wafers W are raised into the processing chamber 30. Once the plurality of wafers W are transferred into the processing chamber 30, the opening and closing mechanism 34 is closed to separate again the cleaning chamber 35 from the processing chamber 30. In this way, the wafers W are placed in the processing chamber 30 (placing step).

Subsequently, a drying step for drying up the wafers W accommodated in the processing chamber 30 is started.

In parallel to the aforementioned cleaning step, rinsing step and wafer placing step, an inert gas (e.g., nitrogen gas) is supplied into the heating apparatus 40 from the inert gas supply source 27 via the inlet 41*a*. Upon passing through the first to fourth spiral portions 51, 52, 53, 54, the nitrogen gas flowing through the piping 50 is heated by the heat applied to the respective spiral portions 51, 52, 53, 54 from the first to fourth heating mechanisms 56, 57, 58, 59.

At this time, the control device 20 controls the amount of power to be supplied to the first heating mechanism 56 from the first power controller 56a as well as controls the amount of power to be supplied to the second heating mechanism 57 from the second power controller 57a, such that the measured values to be obtained from the intermediate temperature sensor 45 becomes a predetermined value, in accordance with the program stored in the storage medium 22. That is to say, the control device 20 determines the output of the first heating mechanism 56 and the output of the second heating mechanism 57, under a feed back control, based on inputs, i.e., the measured values to be obtained from the intermediate temperature sensor 45, such that the temperature of the inert gas during the heating process becomes a preset temperature. Similarly, the control device 20 controls the amount of power to be supplied to the third heating mechanism 58 from the third power controller 58a as well as controls the amount of power to be supplied to the fourth heating mechanism 59 from the fourth power controller 59a, such that the measured values to be obtained from the final temperature sensor 46 becomes a predetermined value, in accordance with the program stored in the storage medium 22. That is to say, the control device 20 determines the output of the third heating mechanism 58 and the output of the fourth heating mechanism 59, under a feed back control, based on inputs, i.e., the measured values to be obtained from the final temperature sensor 46, such that the temperature of the inert gas after the heating process becomes a preset temperature. As the controlling mode due to the control device 20, a variety of known controlling methods can be employed, while the PID controlling method can be mentioned as a generally effective method.

A part of the inert gas heated during this preliminary heating process is introduced into the processing chamber 30, and the remaining inert gas is discharged out from the piping 50 through the drain 48. In this manner, prior to starting the drying step, the temperature of the piping 50 can be maintained at a desired temperature, and upon the start of the drying step, the inert gas, which has been heated to or around a desired temperature, can be supplied from the outlet 44 of the heating apparatus 40.

As shown in FIG. 2, in this embodiment, the drying step includes a first step and a second step. In the first step, a mixed fluid comprising the inert gas and IPA is heated in the heating apparatus 40, and the heated mixed fluid is then supplied into the processing chamber 30 via the injection ports 31. In the second step, the inert gas is heated in the heating apparatus 40, and the heated inert gas is then supplied into the processing chamber 30 via the injection ports 31. Hereinafter, the first step and the second step will be described, in succession.

In the first step, first of all, the inert gas is supplied into the heating apparatus 40 from the inert gas supply source 27 via the inlet 41a, while the liquid IPA is supplied into the heating apparatus 40 from the processing liquid supply source 28 via the inlet 41b. Thus, the inert gas and IPA supplied into the heating apparatus 40 will flow together in the confluence section 42, and then flow through the piping 50, as the mixed fluid.

Upon passing through the first to fourth spiral portions 51, 52, 53, 54 of the piping 50, the mixed fluid is heated by the heat applied from the corresponding heating mechanisms 56, 57, 58, 59. Now, the outputs of the respective heating mechanisms 56, 57, 58, 59 in the first step will be described by using Table 1.

TABLE 1

|  | First step | Second step |
| --- | --- | --- |
| First heating mechanism | Constant value | Feed back control |
| Second heating mechanism | Constant value | Feed back control |
| Third heating mechanism | Feed back control | Feed back control |
| Fourth heating mechanism | Feed back control | Feed back control |

As shown in Table 1, in the first step, the control device 20 controls the amount of power to be supplied from the first power controller 56a to the first heating mechanism 56 as well as controls the amount of power to be supplied from the second power controller 57a to the second heating mechanism 57, such that these amounts will be constant, in accordance with the program stored in the storage medium 22. That is to say, the control device 20 controls the output of the first heating mechanism 56 as well as the output of the second heating mechanism 57, such that these values will be constant. In this case, the output of the first heating mechanism 56 and the output of the second heating mechanism 57 may be set at a rated output or a predetermined ratio (e.g., 70% or 80% or the like) of the rated output. In addition, the control device 20 controls the amount of power to be supplied from the third power controller 58a to the third heating mechanism 58 as well as controls the amount of power to be supplied from the fourth power controller 59a to the fourth heating mechanism 59, such that the measured values to be obtained from the final temperature sensor 46 become predetermined values, respectively, in accordance with the program stored in the storage medium 22. That is to say, the control device 20 determines the output of the third heating mechanism 58 and the output of the fourth heating mechanism 59, under a feed back control, such that the temperature of the mixed fluid after heated will be a preset temperature. Accordingly, during the first step, the intermediate temperature sensor 45 functions as a mere surveillance sensor.

Once the first step of the drying step is started, the liquid IPA is supplied into the heating apparatus 40. The supply amount of IPA is usually set to be 2 ml/sec and at most to be 4 ml/sec. Due to the supply of the liquid IPA, the temperature of the mixed fluid to be produced will be lower than the temperature of the inert gas which has been flowing so far in the piping 50. Also, the temperature of the piping 50 will be lowered, as compared to a desired temperature which has been already maintained.

Meanwhile, as described above, the output of the first heating mechanism 56 and the output of the second heating mechanism 57 are controlled to take constant values, respectively. Accordingly, the measured value to be obtained from the intermediate sensor 45 located just after the second spiral portion 52 which is heated by the second heating mechanism 57 will not fluctuate, i.e., will not change in a repeatedly increased and decreased manner, over time. Preferably, the measured value to be obtained from the intermediate sensor 45 will be once lowered upon the start of the first step, and thereafter, continue to rise. The amount of heat to be applied to the third spiral portion 53 and the fourth spiral portion 54, each provided downstream the intermediate sensor 45, is controlled, based on the measured value to be obtained from the final temperature sensor 46. Consequently, upon passing through the outlet 44 of the heating apparatus 40, the mixed fluid can get a desired temperature, so as to bring the IPA contained in the mixed fluid into a vaporized state.

In this way, the mixed fluid containing the vaporized IPA and nitrogen gas is supplied into the processing chamber 30 via the injection ports 31. Thus, the atmosphere in the processing chamber 30 will be gradually replaced with the mixed fluid containing the vaporized IPA and nitrogen gas. Accordingly, pure water layers and pure water droplets attached to the surfaces of the respective wafers W can be rapidly removed due to the atmosphere containing the vaporized IPA. At this time, particles contained in the pure water layers and/or pure water droplets can also be removed from the surfaces of the respective wafers W, together with the pure water layers and/or pure water droplets, without remaining on the surfaces of the wafers W. The first step as described above is continued, for example, for 60 seconds to 120 seconds, and ended upon stopping the supply of the IPA from the IPA supply source 28.

Once the supply of the IPA from the IPA supply source 28 is stopped, the second step of the drying step is started. In the second step, while the supply of IPA is stopped, the supply of the inert gas into the heating apparatus 40 is still continued from the inert gas supply source 27 via the inlet 41a. The inert gas, upon passing through the first to fourth spiral portions 51, 52, 53, 54 of the piping 50, is heated by the heat applied from the respectively corresponding heating mechanisms 56, 57, 58, 59.

As shown in Table 1, in the second step, the control device 20 controls the amount of power to be supplied from the first power controller 56a to the first heating mechanism 56 as well as controls the amount of power to be supplied from the second power controller 57a to the second heating mechanism 57, such that the measured values to be obtained from the intermediate temperature sensor 45 will be predetermined values, respectively, in accordance with the program stored in the storage medium 22. That is to say, the control device 20 determines the output of the first heating mechanism 56 and the output of the second heating mechanism 57, under a feed back control, such that the temperature of the inert gas during the heating process will be a preset temperature. In addition, the control device 20 controls the amount of power to be supplied from the third power controller 58a to the third heating mechanism 58 as well as controls the amount of power to be supplied from the fourth power controller 59a to the fourth heating mechanism 59, such that the measured values to be obtained from the final temperature sensor 46 will be predetermined values, respectively, in accordance with the program stored in the storage medium 22. That is to say, the control device 20 determines the output of the third heating mechanism 58 and the output of the fourth heating mechanism 59, under a feed back control, such that the temperature of the inert gas after heated will be a preset temperature.

As a result, upon passing through the outlet 44 of the heating apparatus 40, the inert gas will get a desired temperature. The inert gas heated up to the desired temperature is then supplied into the processing chamber 30 via the injection ports 31, thereby discharging the IPA vapor from the interior of the processing chamber 30. Consequently, the atmosphere in the processing chamber 30 can be replaced with the inert gas, leaving the completely dried wafers W. The second step as described above is continued, for example, for 60 seconds to 240 seconds.

As will be apparent from an example detailed below, when the output of the first heating mechanism 56 and the output of the second heating mechanism 57 are constant in the first step, as described above, the number of particles to be left or attached on the wafers W after the drying process will be significantly reduced. Although a mechanism causing such a phenomenon has not yet been clearly known, one of the mechanisms that can be considered as a factor of this phenomenon will now be described. However, the present invention is not limited to the assumed mechanism described below.

Figure 3:
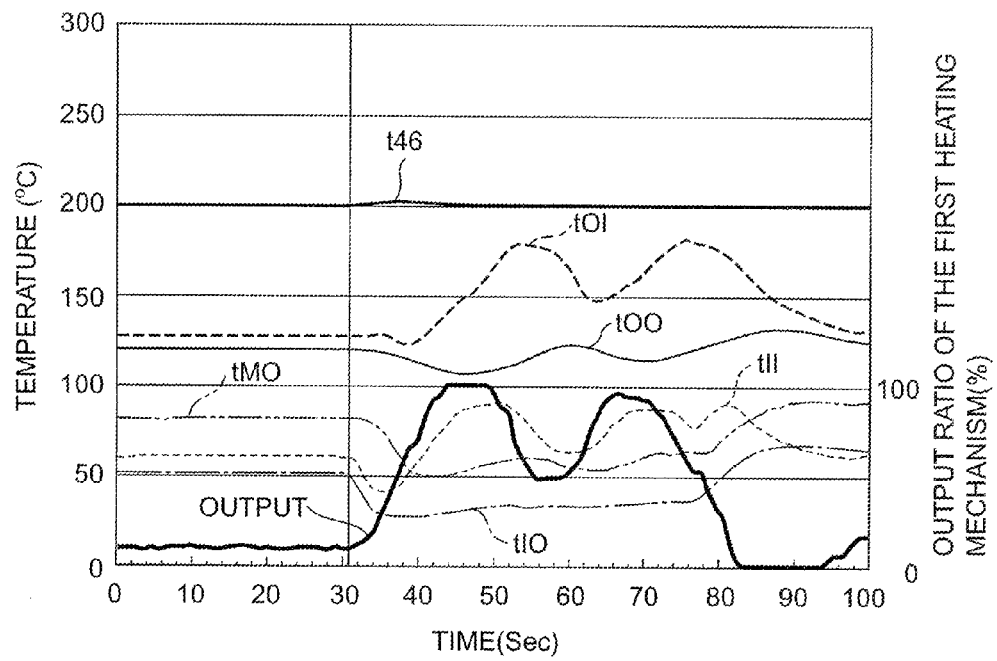
FIG. 3 is a diagram, showing an inlet-side-outer-surface temperature of a first spiral portion, an inlet-side-internal temperature of the first spiral portion, an intermediate-outer-surface temperature of the first spiral portion, an outlet-side-outer-surface temperature of the first spiral portion, an outlet-side-internal temperature of the first spiral portion, a measured value of a final temperature sensor, and a ratio of the output relative to the rated output of a first heating mechanism, over time, during supply of a liquid IPA.
Figure 4:
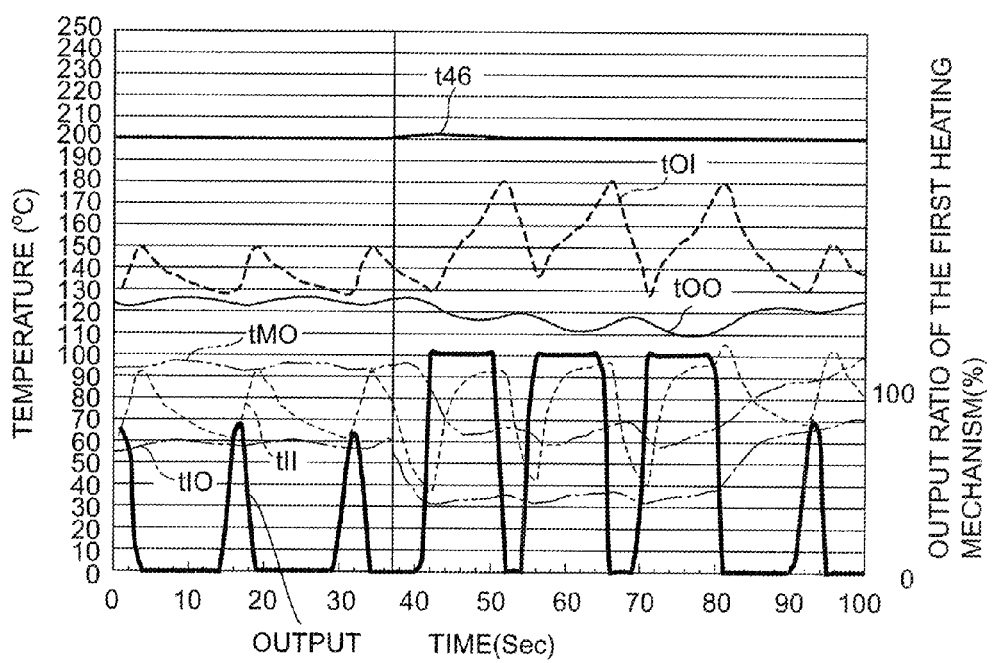
FIG. 4 is a diagram, showing the inlet-side-outer-surface temperature of the first spiral portion, the inlet-side-internal temperature of the first spiral portion, the intermediate-outer-surface temperature of the first spiral portion, the outlet-side-outer-surface temperature of the first spiral portion, the outlet-side-internal temperature of the first spiral portion, the measured value of the final temperature sensor, and the ratio of the output relative to the rated output of the first heating mechanism 56, over time, during the supply of the liquid IPA.

When the output of the first heating mechanism 56 and the output of the second heating mechanism 57 are determined under a feed back control, the temperature in the spiral portion on the upstream side will be changed in a repeatedly increased and decreased manner for several tens of seconds after the start of supplying the liquid IPA. FIGS. 3 and 4 are diagrams, respectively showing an inlet-side-outer-surface temperature tIO of the first spiral portion 51, an inlet-side-internal temperature tII of the first spiral portion 51, an intermediate-outer-surface temperature tMO of the first spiral portion 51, an outlet-side-outer-surface temperature tOO of the first spiral portion 51, an outlet-side-internal temperature tOI of the first spiral portion 51 (in regard to the respective positions, see FIG. 1), a measured value of the final temperature sensor, and a ratio of the output relative to the rated output of the first heating mechanism 56, over time, during the supply of the liquid IPA. In the examples shown in FIGS. 3 and 4, the output of the first heating mechanism 56 is determined by the PID control so as to keep the outlet-side-outer-surface temperature of the first spiral portion 51 at a predetermined temperature. FIG. 4 shows an example in which the sensitivity to the input value of the PID control (the outlet-side-outer-surface temperature tOO) is more enhanced as compared to that of the example shown in FIG. 3.

As shown in FIGS. 3 and 4, for several tens of seconds after the start of supplying the liquid IPA, the temperature of each position in the first spiral portion 51 is changed drastically in a repeatedly increased and decreased manner. That is to say, the temperature of the fluid passing through the first spiral portion 51 is not stabilized during this period. Meanwhile, the temperature of the fluid, upon passing through the final temperature sensor 46, will be stabilized to take a desired value, due to the temperature control using the heating mechanisms provided on the downstream side.

In order to stably vaporize the IPA, it should be effective not only to heat the mixed fluid over a predetermined temperature but also to keep it over the predetermined temperature for a given period of time. That is to say, it might not be preferred for stably and securely vaporizing the IPA to control the output of the heating mechanism on the upstream side, where the temperature lowering due to the supply of IPA is conspicuous, as a changeable output to be obtained by a feed back control (more specifically, the PID control), such that the resultant fluid temperature is changed in a repeatedly increased and decreased manner. Meanwhile, it should be effective for securely vaporizing the IPA to control the output of the heating mechanism as a fixed output, such that the resultant fluid temperature can be raised in an earlier stage as well as in a stabilized manner.

The time when the significant temperature change upon supplying the IPA occurs is a period of time that the supply of IPA is started, and the place where the temperature change upon supplying the IPA becomes conspicuous is in the first spiral portion 51 located on the most upstream side. Accordingly, in view of this point, it can be expected that if at least the output of the heating mechanism 51 located on the most upstream side is set at a proper fixed value for at least a period of time during which a predetermined time passes after the start of supplying the IPA into the heating apparatus 40, the number of particles to be left on the wafers W after dried can be significantly reduced.

According to the embodiment described above, during the first step of the drying step, i.e., during a period of time that the IPA is supplied into the heating apparatus 40, the control device 20 controls the output of the heating mechanism located on the upstream side to be kept at a constant value. Accordingly, the temperature of the mixed fluid flowing in the piping 50, which is heated by the heating apparatus 40, can be stabilized. As a result, it can be expected that the mixed gas containing the inert gas and IPA can be supplied into the processing chamber 30, with the IPA being in a vaporized state. In this manner, the drying process for the wafers can be performed in the processing chamber 30 while effectively preventing attachment of particles on the wafers. In addition, due to the increase of the output of the heating mechanism upon the fixed output mode, it is possible to stably and securely vaporize the liquid IPA even when the supply amount of liquid IPA is increased. Such a processing method for the wafers can be provided only by modifying the control method for an existent equipment of interest.

With respect to the above embodiment, various modifications can be made within the scope of this invention. Hereinafter, examples of such modifications will be described.

In the substrate processing apparatus 10 of the aforementioned embodiment, in addition to those including the temperature sensors described above, many kinds of equipment may be provided in various positions, for example, for monitoring and controlling the state and/or flow rate of the fluid flowing in the piping 50.

Alternatively, in the embodiment described above, while an example, in which the output of the first heating mechanism 56 and the output of the second heating mechanism 57 are determined, in the second step, by the feed back control, based on the measured values to be obtained from the intermediate temperature sensor 45, has been discussed, the present invention is not limited to this aspect. For instance, the output of the first heating mechanism 56 and the output of the second heating mechanism 57 may be determined, respectively, under the feed back control based on various input values, in order to set the temperature of the fluid, during or after the heating, at a preset value. As the various input values, for example, the surface temperature or the like, in either of the positions of the first spiral portion 51 and the second spiral portion 52, can be mentioned.

Similarly, in the embodiment described above, while an example, in which the output of the third heating mechanism 58 and the output of the fourth heating mechanism 59 are determined, in the first step and the second step, by the feed back control based on the measured values to be obtained from the final temperature 46, has been discussed, the present invention is not limited to this aspect. For instance, the output of the third heating mechanism 58 and the output of the fourth heating mechanism 59 may be determined, respectively, under the feed back control based on various input values, in order to set the temperature of the fluid, during or after the heating, at a preset value. As the various input values, for example, the surface temperature or the like, in either of the positions of the third spiral portion 53 and the fourth spiral portion 54, can be mentioned.

Furthermore, while an example, in which the four heating mechanisms 56, 57, 58, 59 are provided, as well as, the corresponding four spiral portions 51, 52, 53, 54 are provided, has been described, the present invention is not limited to this aspect. For example, only a single heating mechanism and only a single spiral portion may be provided. Alternatively, two heating mechanisms and two spiral portions may be provided. Instead, three heating mechanisms and three spiral portions may also be provided. Furthermore, more than four heating mechanisms and more than four spiral portions may be provided.

Additionally, in the embodiment described above, while an example, in which the output of the first heating mechanism 56 and the output of the second heating mechanism 57 are controlled to be a constant value, for a whole period of the first step, has been discussed, the present invention is not limited to such an aspect. As described above, it can be expected that if at least the output of the heating mechanism 51 located on the most upstream side is set at a proper fixed value for at least a period of time during which a predetermined time passes after the start of supplying the IPA into the heating apparatus 40, the number of particles to be left on the wafers W after dried can be significantly reduced. Accordingly, as shown in Table 2, the output of the first heating mechanism 56 and the output of the second heating mechanism 57 may be fixed to be constant, only for a period of time ("initial period" in Table 2) during which a predetermined time passes after the start of supplying the IPA into the heating apparatus 40, i.e., only for a period of time in the first step.

TABLE 2

|  | First step | | |
| --- | --- | --- | --- |
|  | Initial period | After initial period | Second step |
| First heating mechanism | Constant value | Feed back control | Feed back control |
| Second heating mechanism | Constant value | Feed back control | Feed back control |
| Third heating mechanism | Feed back control | Feed back control | Feed back control |
| Fourth heating mechanism | Feed back control | Feed back control | Feed back control |

Furthermore, as shown in Table 2, the output of the first heating mechanism 56 and the output of the second heating mechanism 57 may be kept at a constant value (e.g., 80% of the rated output), only for a period of time ("initial period" in Table 2) during which a predetermined time passes after the start of supplying the IPA into the heating apparatus 40, and in the following period, the output of the first heating mechanism 56 and the output of the second heating mechanism 57 may be kept at another constant value (e.g., 50% of the rated output) than the aforementioned constant value. Alternatively, as shown in Table 3, the first step may be divided into three or more periods, such that the outputs of the heating mechanisms can be controlled in different modes in the respective time periods. In addition, as shown in FIG. 3, the output of the first heating mechanism 56 (e.g., 80% of the rated value) and the output of the second heating mechanism 57 (e.g., 60% of the rated value) may be set at different values, respectively.

TABLE 3

|  | First step | | | |
| --- | --- | --- | --- | --- |
|  | First period | Second period | Third period | Second step |
| First heating mechanism | Constant value (80%) | Constant value (50%) | Feed back control | Feed back control |
| Second heating mechanism | Constant value (60%) | Feed back control | Feed back control | Feed back control |
| Third heating mechanism | Feed back control | Feed back control | Feed back control | Feed back control |
| Fourth heating mechanism | Feed back control | Feed back control | Feed back control | Feed back control |

Moreover, only the output of the heating mechanism on the most upstream side may be fixed to be constant for a period of time during which a predetermined time passes after the start of supplying the IPA into the heating apparatus 40, while the outputs of the other heating mechanisms may be changeable, as determined by the PID control. Otherwise, the outputs of the heating mechanisms other than the heating mechanism located on the most downstream side may be fixed to be constant for a period of time during which a predetermined time passes after the start of supplying IPA into the heating apparatus 40, and the output of the heating mechanism on the most downstream side may be changeable, as determined by the PID control.

While several modifications have been described with reference to the above embodiment, it should be appreciated that the plurality of modifications may also be applied in appropriate combinations.

As described above, the substrate processing apparatus 10 comprises the control device 20 including the computer 21. Due to the control device 20, the respective components of the substrate processing apparatus 10 can be operated so as to perform necessary processes for the wafers W to be processed. Thus, the program to be executed by the computer 21 of the control device 20 in order to carry out the processes for the wafers W by using the substrate processing apparatus 10 should also be included in the subject matter of this invention. Additionally, the computer readable storage medium 22 for storing the program should also be included in the subject matter of this invention.

In the above description, while an example, in which the substrate processing method, substrate processing apparatus, program and storage medium, according to the present invention, are applied to the processes for the wafers W, has been discussed, the present invention is not limited to this aspect, but is also applicable to processes for LCD substrates and/or CD substrates.

EXAMPLES

Now, the present invention will be described in more detail with reference to several examples.

Using the substrate processing apparatus shown in FIG. 1, the drying process, including the first step of: heating the mixed fluid containing the IPA and nitrogen gas and supplying it into the processing chamber; and the second step of heating the nitrogen gas and supplying it into the processing chamber, was provided to the wafers after rinsed. The rated output of the first to fourth heating mechanisms was 2000 W, respectively. The supply amount of the nitrogen in the first step was 100 l/min, and the supply amount of the nitrogen in the second step was also 100 l/min. The total time taken for the second step was 150 seconds.

In the first step and the second step, the output of the third heating mechanism and the output of the fourth heating mechanism were determined, under the feed back control based on the measured values to be obtained from the final temperature sensor, such that the measured values of the final temperature sensor became predetermined values, respectively. In addition, during the second step, the output of the first heating mechanism and the output of the second heating mechanism were determined, under the feed back control based on the measured values to be obtained from the intermediate temperature sensor, such that the measured values of the intermediate temperature sensor became predetermined values, respectively. As the controlling method for the feed back control, the PID control was employed.

Figure 5:
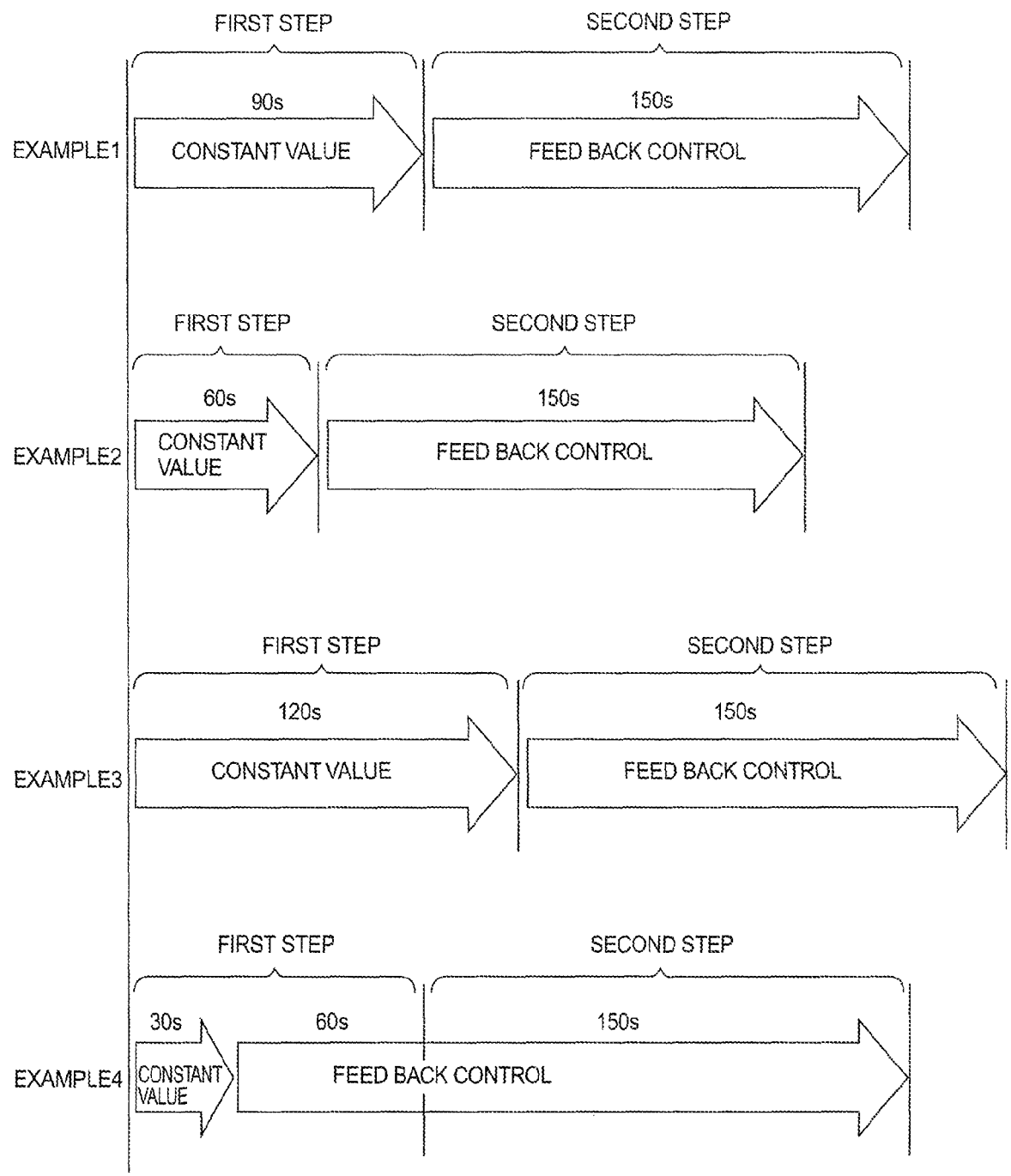
FIG. 5 is a diagram for explaining conditions of controlling the first heating mechanism and a second heating mechanism in a first step of each example.

Hereinafter, conditions individually set for the respective examples and comparative examples will be described with reference to FIG. 5. FIG. 5 is provided for explaining a method for controlling the first heating mechanism and the second heating mechanism during the first step in each example.

Example 1a

As shown in FIG. 5, in Example 1A, the total time taken for the first step was 90 seconds. During the first step, the output of the first heating mechanism and the output of the second heating mechanism were set at a constant value. That is to say, as shown in Table 4, the output value of the first heating mechanism and the output value of the second heating mechanism were set at 60%, 70%, 80%, 90% and 100% of the rated output, in the respective cases (i.e., Examples 1A-1 to 1A-5).

The supply amount of the IPA liquid was 4 ml/sec.

Example 1B

As shown in FIG. 5, in Example 1B, the total time taken for the first step was 90 seconds. During the first step, the output of the first heating mechanism and the output of the second heating mechanism were set at a constant value. That is to say, the output value of the first heating mechanism and the output value of the second heating mechanism were set at 70% of the rated output, respectively.

The supply amount of the IPA liquid was 3 ml/sec.

Example 1C

As shown in FIG. 5, in Example 1C, the total time taken for the first step was 90 seconds. During the first step, the output of the first heating mechanism and the output of the second heating mechanism were set at a constant value. That is to say, the output value of the first heating mechanism and the output value of the second heating mechanism were set at 60% of the rated output, respectively.

The supply amount of the IPA liquid was 2 ml/sec.

Example 2a

As shown in FIG. 5, in Example 2A, the total time taken for the first step was 60 seconds. During the first step, the output of the first heating mechanism and the output of the second heating mechanism were set at a constant value. That is to say, the output value of the first heating mechanism and the output value of the second heating mechanism were set at 80% of the rated output, respectively.

The supply amount of the IPA liquid was 4 ml/sec.

Example 2B

As shown in FIG. 5, in Example 2B, the total time taken for the first step was 60 seconds. During the first step, the output of the first heating mechanism and the output of the second heating mechanism were set at a constant value. That is to say, the output value of the first heating mechanism and the output value of the second heating mechanism were set at 70% of the rated output, respectively.

The supply amount of the IPA liquid was 3 ml/sec.

Example 2C

As shown in FIG. 5, in Example 2C, the total time taken for the first step was 60 seconds. During the first step, the output of the first heating mechanism and the output of the second heating mechanism were set at a constant value. That is to say, the output value of the first heating mechanism and the output value of the second heating mechanism were set at 60% of the rated output, respectively.

The supply amount of the IPA liquid was 2 ml/sec.

Example 3a

As shown in FIG. 5, in Example 3A, the total time taken for the first step was 120 seconds. During the first step, the output of the first heating mechanism and the output of the second heating mechanism were set at a constant value. That is to say, the output value of the first heating mechanism and the output value of the second heating mechanism were set at 80% of the rated output, respectively.

The supply amount of the IPA liquid was 4 ml/sec.

Example 3B

As shown in FIG. 5, in Example 3B, the total time taken for the first step was 120 seconds. During the first step, the output of the first heating mechanism and the output of the second heating mechanism were set at a constant value. That is to say, the output value of the first heating mechanism and the output value of the second heating mechanism were set at 70% of the rated output, respectively.

The supply amount of the IPA liquid was 3 ml/sec.

Example 3C

As shown in FIG. 5, in Example 3C, the total time taken for the first step was 120 seconds. During the first step, the output of the first heating mechanism and the output of the second heating mechanism were set at a constant value. That is to say, the output value of the first heating mechanism and the output value of the second heating mechanism were set at 60% of the rated output, respectively.

The supply amount of the IPA liquid was 2 ml/sec.

Example 4a

As shown in FIG. 5, in Example 4, the total time taken for the first step was 90 seconds. During the first 30 seconds after the start of the first step, the output of the first heating mechanism and the output of the second heating mechanism were set at a constant value. That is to say, as shown in Table 4, the output value of the first heating mechanism and the output value of the second heating mechanism were set at 60% and 100% of the rated output, in the respective cases (i.e., Example 4A-1 and Example 4A-2).

During the remaining 60 seconds of the first step, the output of the first heating mechanism and the output of the second heating mechanism were determined, under the feed back control based on the measured values of the intermediate sensor, such that the measured values to be obtained from the intermediate sensor became predetermined values, respectively. As the controlling method for the feed back control, the PID control was employed.

The supply amount of the IPA liquid was 4 ml/sec.

Comparative Examples 1A, 1B, 1C

In Comparative Example 1, the total time taken for the first step was 90 seconds. During the first step, the output of the first heating mechanism and the output of the second heating mechanism were determined, under the feed back control based on the measured values of the intermediate sensor, such that the measured values to be obtained from the intermediate sensor became predetermined values, respectively. As the controlling method for the feed back control, the PID control was employed.

The supply amount of the IPA liquid was 4 ml/sec, 3 ml/sec and 2 ml/sec (respectively corresponding to the Comparative Example 1A, Comparative Example 1B and Comparative Example 1C).

Comparative Example 2a, 2B, 2C

In Comparative Example 2, the total time taken for the first step was 60 seconds. During the first step, the output of the first heating mechanism and the output of the second heating mechanism were determined, under the feed back control based on the measured values of the intermediate sensor, such that the measured values to be obtained from the intermediate sensor became predetermined values, respectively. As the controlling method for the feed back control, the PID control was employed.

The supply amount of the IPA liquid was 4 ml/sec, 3 ml/sec and 2 ml/sec (respectively corresponding to the Comparative Example 2A, Comparative Example 2B and Comparative Example 2C).

Comparative Example 3a, 3B, 3C

In Comparative Example 3, the total time taken for the first step was 120 seconds. During the first step, the output of the first heating mechanism and the output of the second heating mechanism were determined, under the feed back control based on the measured values of the intermediate sensor, such that the measured values to be obtained from the intermediate sensor became predetermined values, respectively. As the controlling method for the feed back control, the PID control was employed.

The supply amount of the IPA liquid was 4 ml/sec, 3 ml/sec and 2 ml/sec (respectively corresponding to the Comparative Example 3A, Comparative Example 3B and Comparative Example 3C).

(Measurement of the Number of Particles)

For the examples and comparative examples described above, the average number of particles left on one wafer sheet was measured by using a particle counter.

In Table 4, results of the measurements for the Examples 1A-1 to 1A-5, Examples 4A-1 and 4A-2, and Comparative Example 1A are shown. Specifically, Table 4 designates the measurement results in the case of measuring the number of particles having a diameter of 0.06 µm or greater, the measurement results in the case of measuring the number of particles having a diameter of 0.09 µm or greater, and the measurement results in the case of measuring the number of particles having a diameter of 0.16 µm or greater. As is apparent from Table 4, the average number of particles left on one wafer sheet can be significantly reduced in the Examples 1A-1 to 1A-5 as well as in the Examples 4A-1 and 4A-2, as compared with the Comparative Example 1A.

TABLE 4

| | Constant value | | Feed back control Time | Number of particles (pcs/wf) | | |
|---|---|---|---|---|---|---|
| | Time | Output ratio | | 0.06 μm or greater | 0.09 μm or greater | 0.16 μm or greater |
| Example 1A-1 | 90 seconds | 60% | 0 second | 25.3 | 12.4 | 5.6 |
| Example 1A-2 | 90 seconds | 70% | 0 second | 19.3 | 7.2 | 1.3 |
| Example 1A-3 | 90 seconds | 80% | 0 second | 22.3 | 9.0 | 5.9 |
| Example 1A-4 | 90 seconds | 90% | 0 second | 27.0 | 10.3 | 4.3 |
| Example 1A-5 | 90 seconds | 100% | 0 second | 29.2 | 7.7 | 3.4 |
| Example 4A-1 | 30 seconds | 60% | 60 seconds | 33.9 | 17.8 | 10.6 |
| Example 4A-2 | 30 seconds | 100% | 60 seconds | 36.9 | 11.6 | 5.7 |
| Comparative Example 1A | — | — | 90 seconds | 154.8 | 50.8 | 26.3 |

Figure 6:
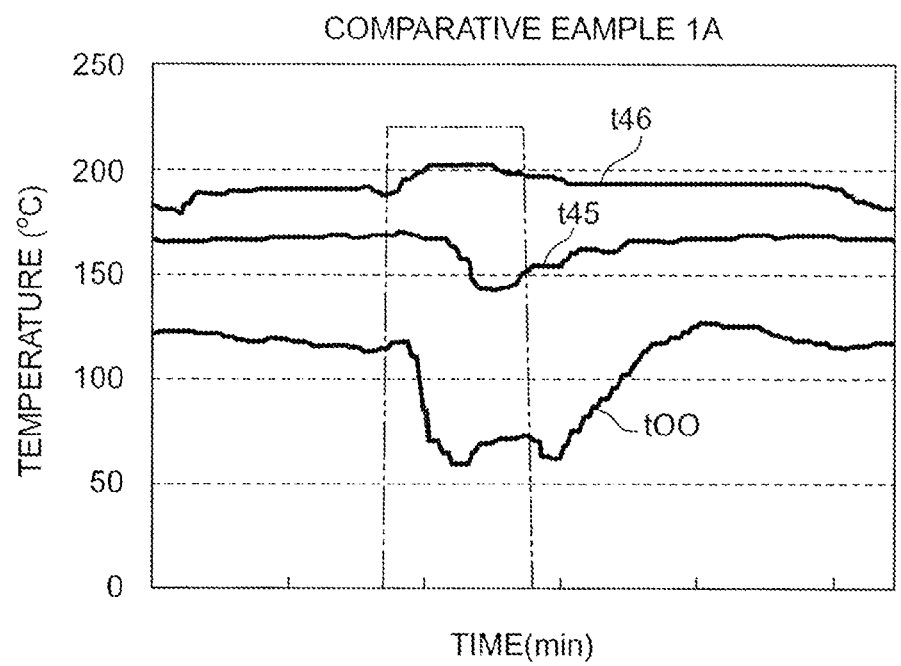
FIG. 6 is a diagram, showing a measured value of the final temperature sensor, a measured value of an intermediate temperature sensor, and a temperature measured value of an outlet-side-outer-surface of a first spiral portion, of a comparative 1A and an example 1A-3, over time.
Figure 7:
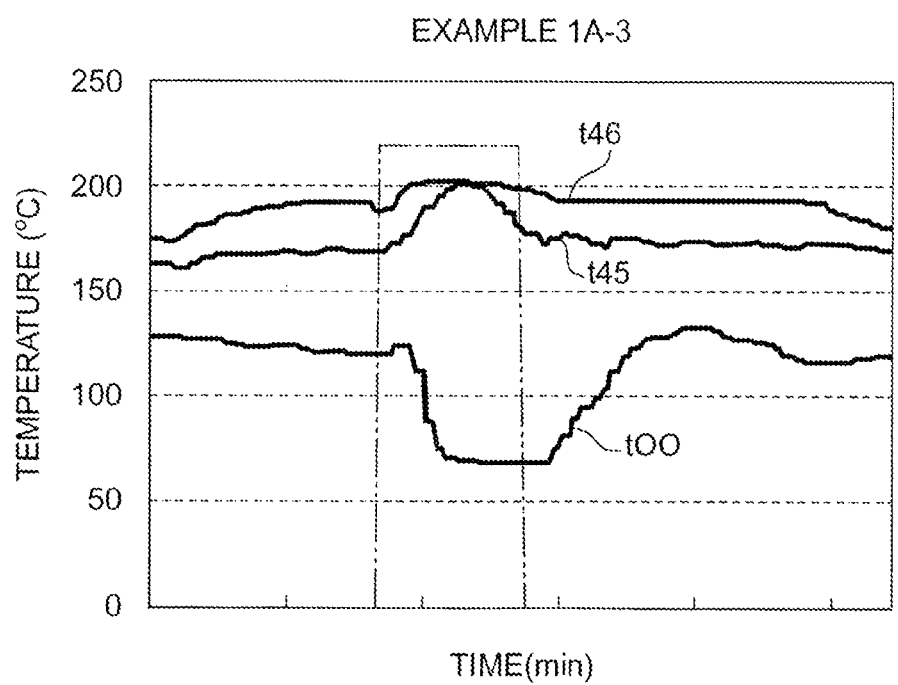
FIG. 7 is a diagram, showing the measured value of the final temperature sensor, the measured value of the intermediate temperature sensor, and the temperature measured value of the outlet-side-outer-surface of the first spiral portion, of the comparative 1A and the example 1A-3, over time.

In FIGS. 6 and 7, the measured value t46 of the final temperature sensor, the measured value t45 of the intermediate sensor, and the measured value tOO of the outlet-side-outer-surface temperature of the first spiral portion (see FIG. 1), in the Comparative Example 1A and the Example 1A-3, are expressed relative to the time. During the time expressed by a chain double-dashed line in the drawings, the first step was started. Not only in the Example but also in the Comparative Example, the measured value of the final temperature sensor was stabilized to be substantially constant.

Figure 8:
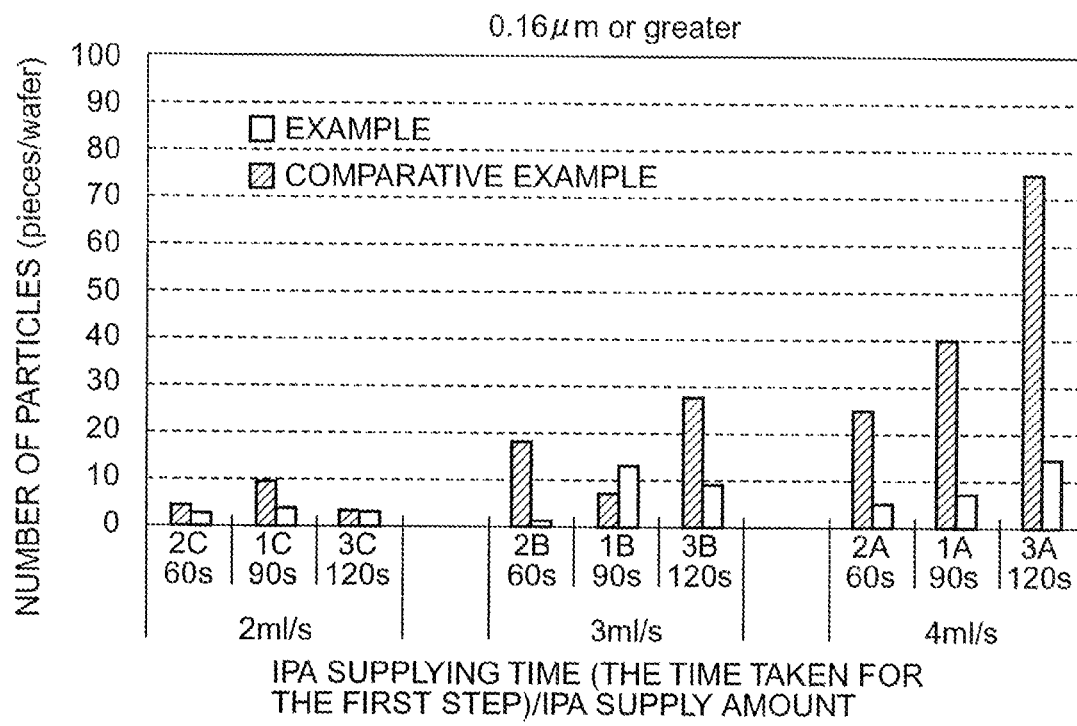
FIG. 8 is a graph, showing particle measurement results of each example (without oblique lines), and those of corresponding comparative examples (with oblique lines).
Figure 9:
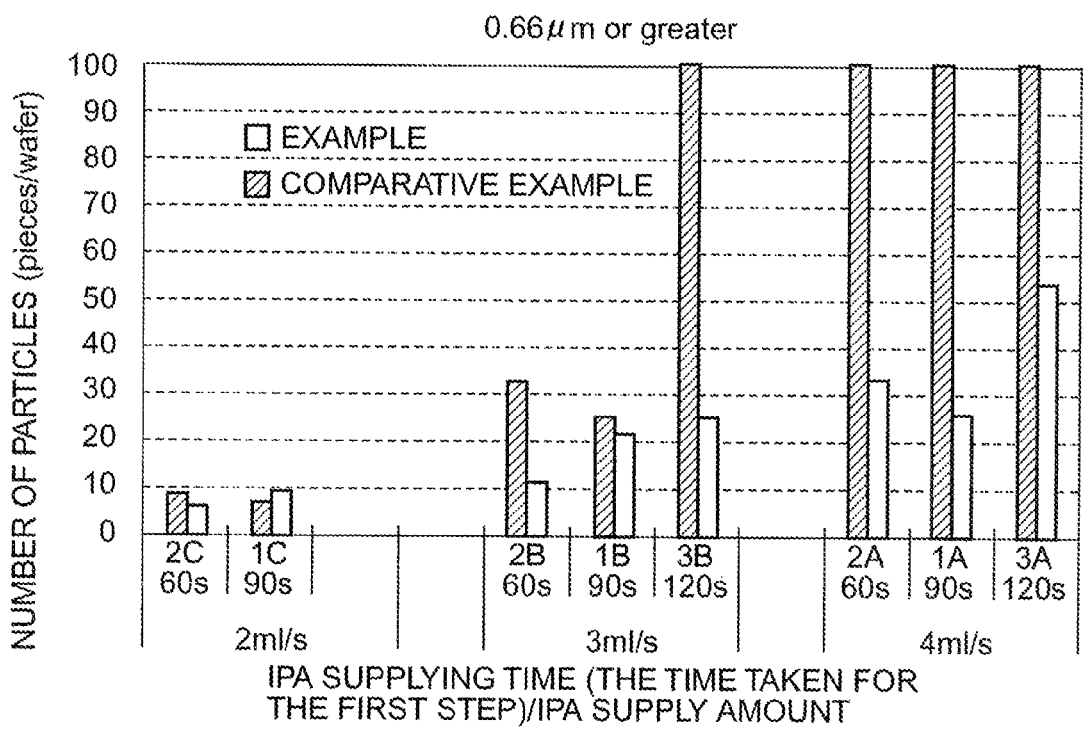
FIG. 9 is a graph, showing particle measurement results of each example (without oblique lines), and those of corresponding comparative examples (with oblique lines).

FIGS. 8 and 9 are graphs, respectively showing particle measurement results of each example (without oblique lines), and those of corresponding comparative examples (with oblique lines). FIG. 8 presents the measurement results of the case of measuring the number of particles having a diameter 0.16 μm or greater by using a particle counter, while FIG. 9 shows the measurement results of the case of measuring the number of particles having a diameter of 0.06 μm or greater. As the measurement results of the Example 1A in FIGS. 8 and 9, the measurement results of the Example 1A-3 were used. From these results, it can be seen that in the cases where the supply amount of IPA is 3 ml/sec and 4 ml/sec, the average number of particles left on one wafer sheet can be significantly reduced, as compared with the Comparative Examples, regardless of the time taken for the first step.

What is claimed is:

1. A substrate processing method for drying a substrate, by using a fluid heated by a heating apparatus including an inlet, an outlet, and a plurality of heating mechanisms for heating the fluid flowing from the inlet to the outlet, the method comprising the steps of:
    placing a substrate in a processing chamber; and
    supplying a gas and a processing liquid, into the heating apparatus, from the inlet, heating a mixed fluid containing the gas and the processing liquid, in the heating apparatus, as well as supplying the heated mixed fluid discharged from the outlet of the heating apparatus, into the processing chamber in which the substrate is placed,
    wherein, in the step of supplying the mixed fluid into the processing chamber, an output of one of the plurality of heating mechanisms located nearest to the inlet of the heating apparatus is kept at a preset constant value for a period of time during which a predetermined time passes after the start of supplying the processing liquid into the heating apparatus, while an output of one of the plurality of heating mechanisms located nearest to the outlet is determined, under a feed back control, in order to set the temperature of the mixed fluid, during or after the heating process, at a preset value.

2. The substrate processing method according to claim 1, wherein, in the step of supplying the mixed fluid into the processing chamber, the output of the heating mechanism located nearest to the inlet is kept at the constant value for a period of time during which the processing liquid is supplied into the heating apparatus.

3. A storage medium for storing a program to be executed by a control device that controls a substrate processing apparatus including a heating apparatus having an inlet, an outlet, and a plurality of heating mechanisms that heat a fluid flowing from the inlet to the outlet, wherein the program is configured to perform the substrate processing method according to claim 1.

* * * * *